United States Patent
Yamada et al.

(10) Patent No.: US 8,466,439 B2
(45) Date of Patent: Jun. 18, 2013

(54) ELECTRON BEAM LITHOGRAPHY APPARATUS AND ELECTRON BEAM LITHOGRAPHY METHOD

(75) Inventors: Akio Yamada, Tokyo (JP); Tomohiro Sakazaki, Tokyo (JP); Hiroshi Yasuda, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 13/068,995

(22) Filed: May 25, 2011

(65) Prior Publication Data
US 2011/0226967 A1    Sep. 22, 2011

Related U.S. Application Data

(63) Continuation of application No. PCT/JP2009/056325, filed on Mar. 27, 2009.

(51) Int. Cl.
*G21K 5/00* (2006.01)
*H01J 37/317* (2006.01)

(52) U.S. Cl.
CPC ................... *H01J 37/3175* (2013.01)
USPC .............. 250/492.22; 250/492.1; 250/492.2

(58) Field of Classification Search
USPC ................. 250/492.1, 492.2, 492.22, 492.23, 250/492.3
See application file for complete search history.

(56) References Cited

U.S. PATENT DOCUMENTS

| | | | |
|---|---|---|---|
| 5,384,466 A * | 1/1995 | Nakamura et al. ........ | 250/492.22 |
| 6,344,655 B1 | 2/2002 | Sakazaki et al. | |
| 6,774,380 B2 | 8/2004 | Abe | |
| 7,002,164 B2 * | 2/2006 | Goldstein et al. .......... | 250/492.2 |
| 7,714,308 B2 * | 5/2010 | Hiroshima ............... | 250/492.23 |
| 2007/0023703 A1 * | 2/2007 | Sunaoshi et al. ......... | 250/492.22 |
| 2008/0050848 A1 * | 2/2008 | Abe .............................. | 438/14 |
| 2008/0054196 A1 * | 3/2008 | Hiroshima ............... | 250/492.23 |
| 2008/0203324 A1 * | 8/2008 | Fujimura et al. ......... | 250/492.23 |
| 2011/0226967 A1 * | 9/2011 | Yamada et al. ............ | 250/492.2 |

FOREIGN PATENT DOCUMENTS

| | | |
|---|---|---|
| JP | 02-299221 | 12/1990 |
| JP | 04-071218 | 3/1992 |

(Continued)

OTHER PUBLICATIONS

Haraguchi et al. "Multicolumn cell: Evaluation of the proof of concept system", J. Vac. Sci. Technol. May/Jun. 2004, pp. 985-988.

(Continued)

*Primary Examiner* — David A Vanore
*Assistant Examiner* — Wyatt Stoffa
(74) *Attorney, Agent, or Firm* — Muramatsu & Associates

(57) ABSTRACT

An electron beam lithography apparatus includes a storage for storing data on a drawing pattern assigned a rank based on an accuracy required for a device pattern, a drawing pattern adjustment unit to generate data on divided drawing patterns based on the rank, a settlement wait time adjustment unit to determine a settlement wait time based on the rank, and a controller to draw the device pattern while irradiating an electron beam based on the data on the divided drawing patterns and the settlement wait time. The drawing pattern adjustment unit determines upper limits on the long-side length of a divided drawing pattern or on the area of the divided drawing pattern based on the rank, and divides the drawing pattern based on the upper limits.

6 Claims, 13 Drawing Sheets

FOREIGN PATENT DOCUMENTS

| | | |
|---|---|---|
| JP | 2000-277417 | 10/2000 |
| JP | 2003-077821 | 3/2003 |
| JP | 2004-072123 | 3/2004 |
| JP | 2004-088071 | 3/2004 |
| JP | 2008-277540 | 11/2008 |

OTHER PUBLICATIONS

Office action for counterpart German application by German Patent Office and its English translation.

* cited by examiner

| RANK | X1 | Y1 | Lx | Ly | ... |

LONG-SIDE LENGTH UPPER LIMIT
OR AREA UPPER LIMIT MEMORY

WAIT TIME DEFINITION MEMORY

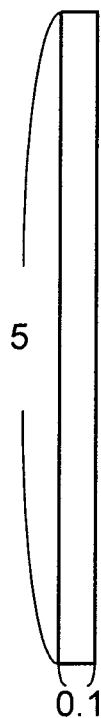
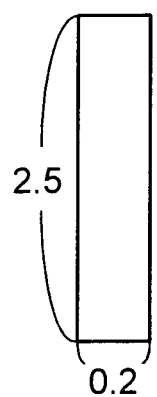
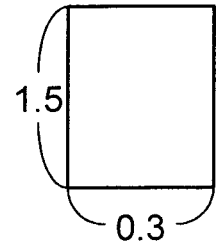
FIG. 8A          FIG. 8B          FIG. 8C
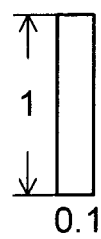
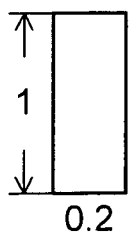
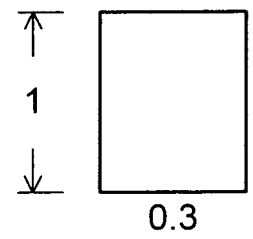
FIG. 8D          FIG. 8E          FIG. 8F

ELECTRON BEAM LITHOGRAPHY APPARATUS AND ELECTRON BEAM LITHOGRAPHY METHOD

CROSS-REFERENCE TO THE RELATED ART

This application is a continuation of prior International Patent Application No. PCT/JP2009/056325, filed Mar. 27, 2009, the entire contents of which are incorporated herein by reference.

BACKGROUND OF THE INVENTION

1. Field of the Invention

The present invention relates to an electron beam lithography apparatus and an electron beam lithography method. In particular, the present invention relates to an electron beam lithography apparatus and an electron beam lithography method which are capable of achieving a higher drawing speed while ensuring drawing accuracy by adjusting an electron beam in accordance with the degree of importance of a device pattern to be formed on a sample.

2. Description of the Prior Art

For the purpose of improving throughput, an electron beam lithography apparatus is provided with a variable rectangular opening or a plurality of stencil mask patterns in a stencil mask, and transfers a desired pattern onto a wafer through exposure by selectively using the opening or patterns with beam deflection.

For example, Japanese Patent Application Publication No. 2004-88071 discloses an electron beam exposure apparatus for character projection lithography as such a lithography apparatus. The character projection lithography is performed as follows. Firstly, a beam is applied to one pattern region, e.g., a 300 µm×300 µm region, selected by beam deflection from a plurality of stencil patterns, e.g., 100 stencil patterns, disposed on a mask to shape a beam cross section into the shape of a stencil pattern. The beam which has passed through the mask is deflected and bent back by a downstream deflector, reduced at a certain reduction ratio, e.g., 1/10, which is determined depending on the electrooptic system, and transferred onto the surface of a sample. When stencil patterns on the mask are appropriately prepared in accordance with a device pattern to be transferred, the number of necessary exposure shots is greatly reduced, and the throughput is improved, in comparison with the case where only a variable rectangular opening is provided.

Further, there has been proposed a multi-column electron beam exposure apparatus collectively including multiple columns (hereinafter referred to as column cells) each of which is a small-sized column of an exposure apparatus such as described above, and which are arranged over a wafer to perform exposure in parallel (can be referred to, T. Haraguchi et al. J. Vac. Sci. Technol, 2004, B22, 985). Each of the column cells is equivalent to a column of a single-column electron beam exposure apparatus, and the multi-column apparatus as a whole multiplies an exposure throughput by the number of columns because of parallel processing.

When exposure is performed, the deflection position of an electron beam is changed by a deflector. At this time, since the deflector is given a signal corresponding to a deflection amount, there is a settlement wait time until the electron beam settles at a deflected position.

In general, an exposure region is divided into multiple subfields. A deflection amount is fixed such that a deflection position by a main deflector is around the center of one subfield. A voltage corresponding to exposure data is applied to a sub-deflector. Thus, a pattern within the subfield is drawn. Exposure is performed at high speed by reducing the frequency of deflections by the main deflector, which requires a long settlement wait time, as described above.

As a technique for reducing a settlement wait time, for example, Japanese Patent Application Publication No. 2004-72123 describes a technique of reducing an apparent settlement wait time to approximately 3 µs in deflection by a main deflector by detecting a difference between main deflection data and a voltage actually applied to the main deflector, and applying this difference to a feedback deflector.

As described above, the throughput of drawing is improved by using character projection lithography or a variable rectangular beam. The throughput can be further improved by using multiple columns at the same time.

Moreover, even when there is a settlement wait time after electron beam deflection, the overall throughput of processing can also be improved by increasing the size of a beam to be applied using character projection lithography or a variable rectangular beam.

However, as the size of the beam increases, the scattering of electrons in the beam increases due to Coulomb effects, and the difficulty of high-accuracy drawing increases. Accordingly, a drawing pattern requiring high accuracy must be drawn with the size of the beam reduced. Thus, it is difficult to improve processing speed.

Further, there are device patterns for various uses such as gate portions of transistors and interconnections. Respective accuracies required for device patterns are not necessarily uniformly equal to each other. If all device patterns are drawn with an accuracy for device patterns requiring high accuracy, high-accuracy drawing can be performed overall, but, on the other hand, it will become difficult to improve processing speed.

SUMMARY OF THE INVENTION

The present invention has been made in view of the above-described problems in the conventional art. An object of the present invention is to provide an electron beam lithography apparatus and an electron beam lithography method which enables high-speed and high-accuracy drawing by adjusting the shape of an electron beam and a deflection settlement wait time in accordance with the degree of importance of a device pattern to be formed on a sample.

The above-described problems are resolved by an electron beam lithography apparatus including a storage to store data on a drawing pattern assigned a rank in accordance with an accuracy required for a device pattern to be formed on a sample; a divided drawing pattern data generation unit to generate data on divided drawing patterns obtained by dividing the drawing pattern in accordance with the rank; a settlement wait time determination unit to determine, in accordance with the rank, a settlement wait time until an irradiation position of an electron beam settles after the deflection of the electron beam; and a controller to draw the device pattern while irradiating the electron beam on the basis of the data on the divided drawing patterns in accordance with the rank and the settlement wait time in accordance with the rank.

The electron beam lithography apparatus according to the embodiment, further including: a beam shaping unit to at least shape the electron beam into a rectangular shape, and shape the electron beam by selecting part of a predetermined mask pattern. In a case where the electron beam is shaped into a rectangular shape, the divided drawing pattern data generation unit may determine at least any one of an upper limit on a long-side length of each divided drawing pattern and an upper limit on an area of the divided drawing pattern based on the rank of the drawing pattern, and divide the drawing pattern into divided drawing patterns in accordance with at least any one of the upper limits. In a case where the electron beam is shaped by selecting part of the predetermined mask pattern, the divided drawing pattern data generation unit may determine an upper limit on a partial irradiation range of the mask pattern based on the rank of the drawing pattern, and determine a use range of the mask pattern in accordance with the upper limit, and the settlement wait time determination unit may determine the settlement wait time in accordance with a deflection travel amount of the electron beam based on the rank.

In the electron beam lithography apparatus according to the embodiment, the divided drawing pattern data generation unit may include upper limit memory in which the upper limit is defined for each of the ranks, and determine the upper limit by specifying an address corresponding to the rank in the upper limit memory, and the settlement wait time determination unit may include wait time memory in which the wait time is defined for each of the ranks, and determine the settlement wait time by specifying an address of a memory area in the wait time memory corresponding to both of the rank and the deflection travel amount of the electron beam.

In the present invention, in accordance with a rank indicating the degree of importance of a device pattern to be formed on a sample, data on a drawing pattern is adjusted, and a settlement wait time after deflection is also adjusted. For drawing patterns of a high degree of importance, an upper limit on the area of a drawing pattern obtained by division is adjusted to be not more than a required small value, and the wait time after deflection is adjusted to be a time required for the position of an electron beam to settle. On the other hand, for drawing patterns of a low degree of importance, an upper limit on the area of a drawing pattern obtained by division is adjusted to be not more than a value larger than the upper limit for the drawing patterns of the high degree of importance, and the wait time after deflection is adjusted to be shorter than the wait time for the drawing patterns of the high degree of importance. As described above, processing speed can be improved with pattern accuracy ensured, by giving a higher priority to drawing time than to drawing accuracy for the drawing patterns of the low degree of importance, and giving a higher priority to drawing accuracy than to drawing time for the drawing patterns of the high degree of importance.

BRIEF DESCRIPTION OF THE DRAWINGS

FIGS. 8A to 8F are views (part 2) for explaining the division of drawing patterns in accordance with rank;

DESCRIPTION OF THE PREFERRED EMBODIMENTS

Hereinafter, an embodiment of the present invention is described with reference to the drawings.

First, a description is made of the configuration of an electron beam exposure apparatus as one example of an electron beam lithography apparatus. Next, a description is made of drawing pattern rank which indicates the degree of importance of a device pattern to be formed on a sample. Then, a description is made of the division of a drawing pattern in accordance with drawing pattern rank. Subsequently, a description is made of the adjustment of a wait time for deflection settling in accordance with drawing pattern rank. Finally, an electron beam lithography method is described.

(Configuration of Electron Beam Exposure Apparatus)

Figure 1:
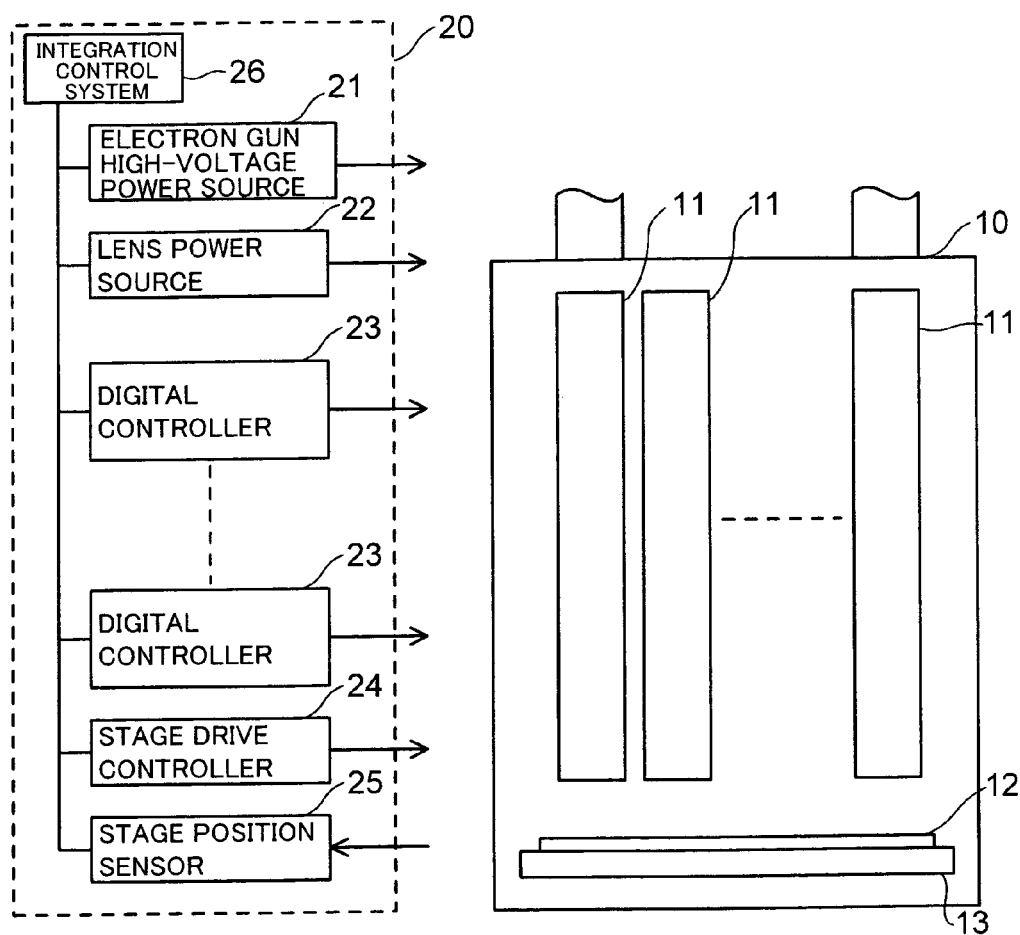
FIG. 1 is a diagram showing the configuration of a multi-column electron beam exposure apparatus according to the present invention.

FIG. 1 is a schematic diagram showing the configuration of the multi-column electron beam exposure apparatus according to this embodiment.

The multi-column electron beam exposure apparatus is broadly divided into an electron beam column 10 and a controller 20 to control the electron beam column 10. As to the electron beam column 10, multiple equivalent column cells 11, e.g., 16 equivalent column cells, collectively constitute the entire column. All the column cells 11 include the same units described later. Under the column cells 11, a wafer stage 13 is disposed on which, for example, a 300 mm wafer 12 is mounted.

The controller 20 includes an electron gun high-voltage power source 21, a lens power source 22, digital controllers 23, a stage drive controller 24, and a stage position sensor 25. The electron gun high-voltage power source 21 supplies power to drive an electron gun of each column cell 11 in the electron beam column 10. The lens power source 22 supplies power to drive electromagnetic lenses of each column cell 11 in the electron beam column 10. Each of the digital controllers 23 is an electric circuit to control a deflection output of each deflector of the corresponding column cell 11, and outputs a high-speed deflection output and the like. The number of digital controllers 23 to be prepared is equal to the number of column cells 11.

The stage drive controller 24 causes the wafer stage 13 to move based on position information from the stage position sensor 25 so that an electron beam may be applied to a desired position on the wafer 12. The above-described sections 21 to 25 are comprehensively controlled by an integration control system 26 such as a workstation.

In the above-described multi-column electron beam exposure apparatus, all the column cells 11 have the same column units.

Figure 2:
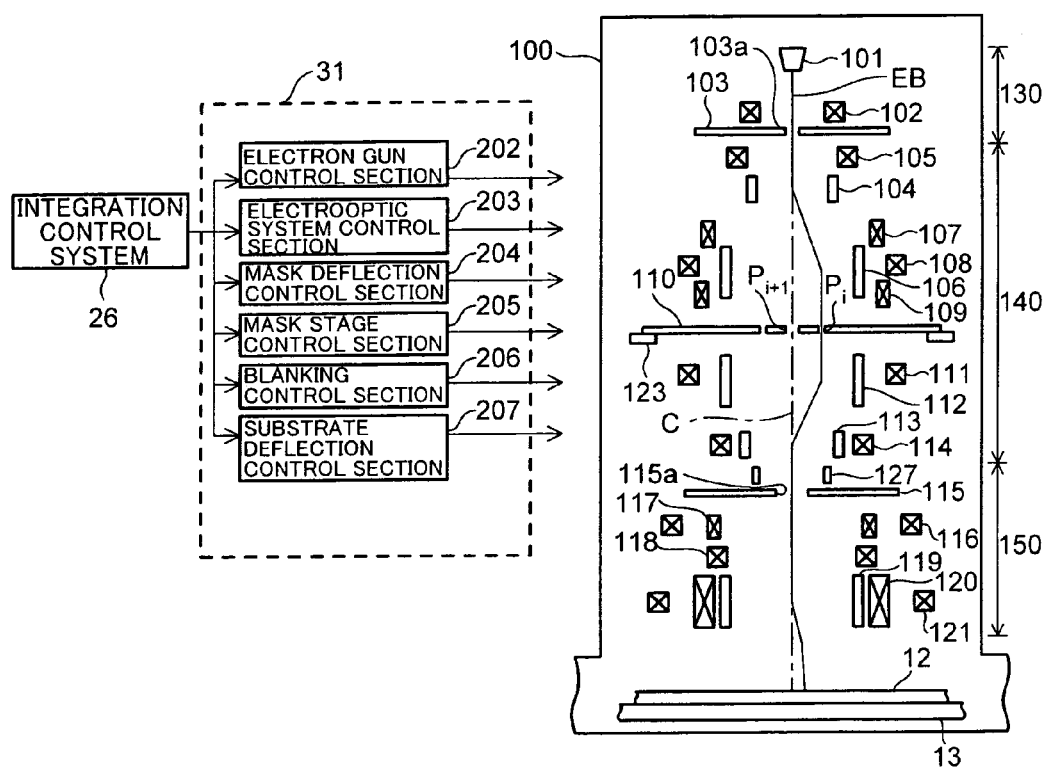
FIG. 2 is a diagram showing the configuration of one of column cells in the exposure apparatus of FIG. 1.

FIG. 2 is a schematic diagram showing the configuration of each column cell 11 which is used in the multi-column electron beam exposure apparatus.

Each column cell 11 is broadly divided into an exposure unit 100 and column cell controllers 31 to control the exposure unit 100. The exposure unit 100 includes an electron beam generation section 130, a mask deflection section 140, and a substrate deflection section 150.

In the electron beam generation section 130, an electron beam EB generated in an electron gun 101 is subjected to the converging action of a first electromagnetic lens 102, and then passes through a rectangular aperture 103a of a beam-shaping mask 103. As a result, the electron beam EB is shaped to have a rectangular cross section.

Then, the electron beam EB is imaged onto an exposure mask 110 by a second electromagnetic lens 105 of the mask deflection section 140. The electron beam EB is also deflected by first and second electrostatic deflectors 104 and 106 toward a specific pattern P formed in the exposure mask 110, and the cross-sectional shape of the electron beam EB is shaped into the shape of the pattern P.

Incidentally, though the exposure mask 110 is fixed to a mask stage 123 in the electron beam column 10, the mask stage 123 is movable in a horizontal plane. In the case where a pattern P is used which is in a region outside the deflection range (beam deflection region) of the first and second electrostatic deflectors 104 and 106, the mask stage 123 is moved so that the pattern P may be moved to the inside of the beam deflection region.

Third and fourth electromagnetic lenses 108 and 111 disposed above and under the exposure mask 110 are responsible for imaging the electron beam EB onto a substrate by adjusting the amounts of the currents flowing into the third and fourth electromagnetic lenses 108 and 111.

The electron beam EB which has passed through the exposure mask 110 is bent back to the optical axis C by the deflecting actions of third and fourth electrostatic deflectors 112 and 113, and then the size of the electron beam EB is reduced by a fifth electromagnetic lens 114.

The mask deflection section 140 includes first and second correction coils 107 and 109 which correct beam deflection aberration produced by the first to fourth electrostatic deflectors 104, 106, 112, and 113.

Then, the electron beam EB passes through an aperture 115a of the shield 115 partially constituting the substrate deflection section 150, and is projected onto a substrate (wafer 12) by a first and a second electromagnetic projection lenses 116 and 121. Thus, an image of the pattern of the exposure mask 110 is transferred onto the substrate at a predetermined reduction ratio, e.g., 1/10.

The substrate deflection section 150 includes a fifth electrostatic deflector 119 and an electromagnetic deflector 120 which deflect the electron beam EB so that an image of the pattern of exposure mask 110 is projected onto a predetermined position on the substrate.

The substrate deflection section 150 further includes third and fourth correction coils 117 and 118 to correct the deflection aberration of the electron beam EB on the substrate.

The column cell controller 31 includes an electron gun control section 202, an electrooptic system control section 203, a mask deflection control section 204, a mask stage control section 205, a blanking control section 206, and a substrate deflection control section 207. The electron gun control section 202 controls the electron gun 101 to control the acceleration voltage, beam irradiation conditions, and the like of the electron beam EB. The electrooptic system control section 203 controls parameters such as the amounts of currents flowing into the electromagnetic lenses 102, 105, 108, 111, 114, 116, and 121 to adjust the magnifications, focal point positions, and the like of electrooptic systems constituting these electromagnetic lenses. The blanking control section 206 controls the voltage applied to a blanking electrode 127 to deflect the electron beam EB, which has been being generated before the start of exposure, onto the shield 115. As a result, the blanking control section 206 prevents the electron beam EB from being applied onto the substrate before exposure.

The substrate deflection control section 207 controls the voltage applied to the fifth electrostatic deflector 119 and amount of current flowing into the electromagnetic deflector 120 to deflect the electron beam EB onto a predetermined position on the substrate. The above-described sections 202 to 207 are comprehensively controlled by the integration control system 26 such as a workstation.

Figure 3:
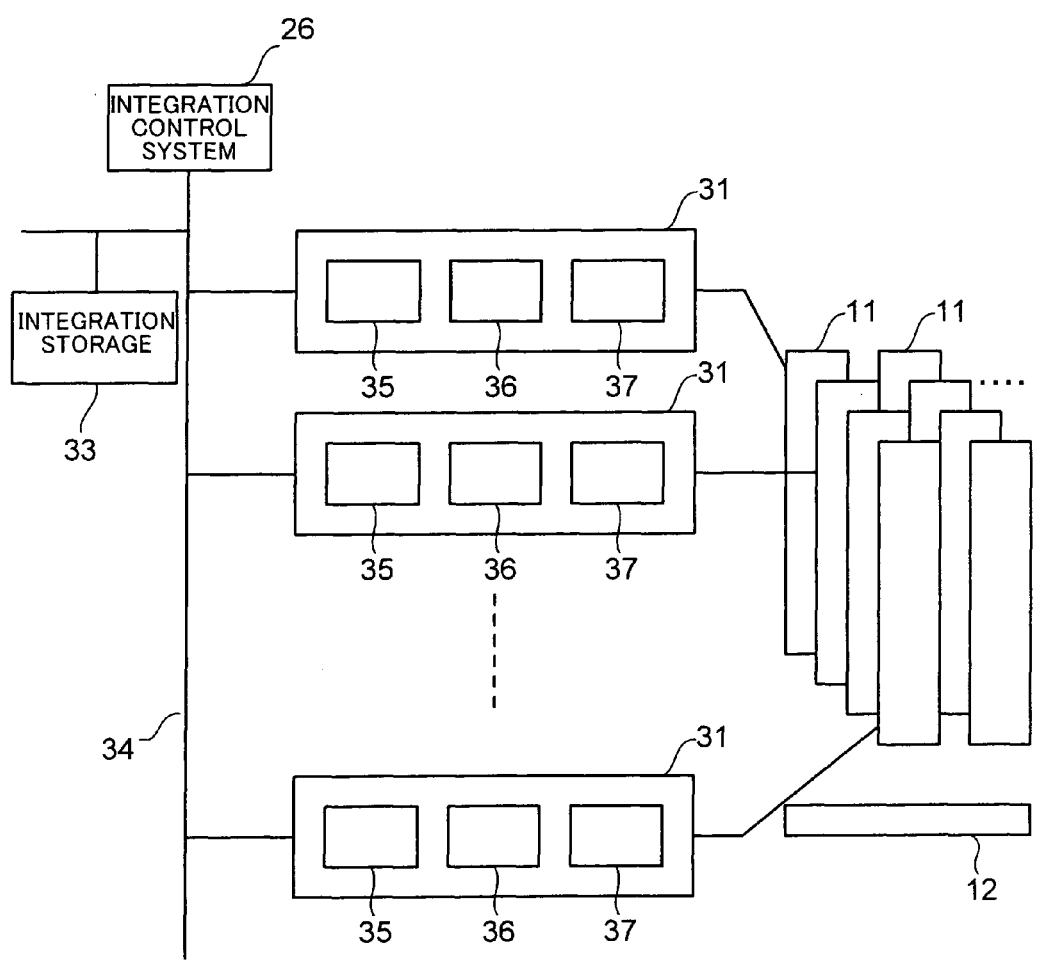
FIG. 3 is a schematic diagram of column cell controllers in the exposure apparatus of FIG. 1.

FIG. 3 is a schematic diagram of column cell controllers 31 on the multi-column electron beam exposure apparatus. The column cell controllers 31 are possessed by the column cells 11, respectively. The column cell controllers 31 are connected via a bus 34 to the integration control system 26 to control the entire multi-column electron beam exposure apparatus. An integration storage 33 stores all the data, such as exposure data, which is needed by the column cells. The comprehensive storage 33 is also connected to the integration control system 26 via the bus 34.

In the multi-column electron beam exposure apparatus configured as described above, exposure data on a pattern to be exposed on a wafer 12 mounted on the wafer stage 13 is transferred from the integration storage 33 to respective column cell storages 35 of the column cell controllers 31. The transferred exposure data is corrected in respective correction sections 36 of the column cell controllers 31 and converted in exposure data conversion sections 37 into data necessary for actual exposure. Thus, the same pattern is exposed onto exposure regions on the wafer 12 which are respectively assigned to the column cells 11. Each of the correction sections 36 includes a divided drawing pattern data generation unit 36a and a settlement wait time determination unit 36b, which are described later.

(Drawing Pattern Ranks)

The above-described lithography apparatus is used to form device patterns on a sample. The device patterns include various kinds of patterns: gate patterns, interconnection patterns, shield patterns, via patterns, power line patterns, dummy patterns, and the like. These device patterns have different roles in a device. Accuracies required for the formation positions and sizes of patterns differ among device patterns.

For example, since the position and size of a gate pattern determine device characteristics, high drawing accuracy is required for the gate pattern. On the other hand, even if the actually-formed positions and sizes of a power line pattern, a dummy pattern and the like vary more or less from the design values thereof, such variation has only small effects on the performance of the device. Accordingly, drawing accuracy for such device patterns does not need to be high.

Thus, the range of accuracies required for device patterns, which ranges from a high accuracy to a low accuracy, is divided into predetermined ranges, and device patterns are divided accordingly. The even ranges are referred to as ranks. For example, ranks include three ranks: high rank, medium rank, and low rank. Higher rank requires higher accuracy and indicates that the degree of importance of a device pattern of the rank is higher. Such rank information is used to improve the throughput of drawing.

Factors contributing to the difficulty of improving the throughput include a small per-shot drawing area and a long wait time after beam deflection. Accordingly, the throughput can be improved by increasing the per-shot drawing area. However, in this case, accuracy may decrease. Specifically, the increase of the drawing area increases the amount of current to cause the diffusion of electrons due to Coulomb effects, thus resulting in the difficulty of obtaining a desired drawn pattern.

On the other hand, shortening the wait time after beam deflection can improve the overall throughput, but results in the application of an electron beam with the position thereof being unstable. Accordingly, accuracy may decrease.

The above-described throughput improvement measures cannot be taken for high-rank device patterns, since accuracy is the top priority for high-rank device patterns. On the other hand, for low-rank device patterns, high accuracy is not required, and, even if drawing positions and the like have some errors, such errors have only small effects on the device. Accordingly, throughput improvement measures are taken for low-rank device patterns.

Incidentally, the ratio of low-rank device patterns to the entire device to be fabricated seems to be at least approximately 30%, though depending on each device. Accordingly, throughput improvement measures only for low-rank device patterns can improve the throughput while ensuring required accuracy overall.

(Division of Drawing Pattern)

Figure 4:
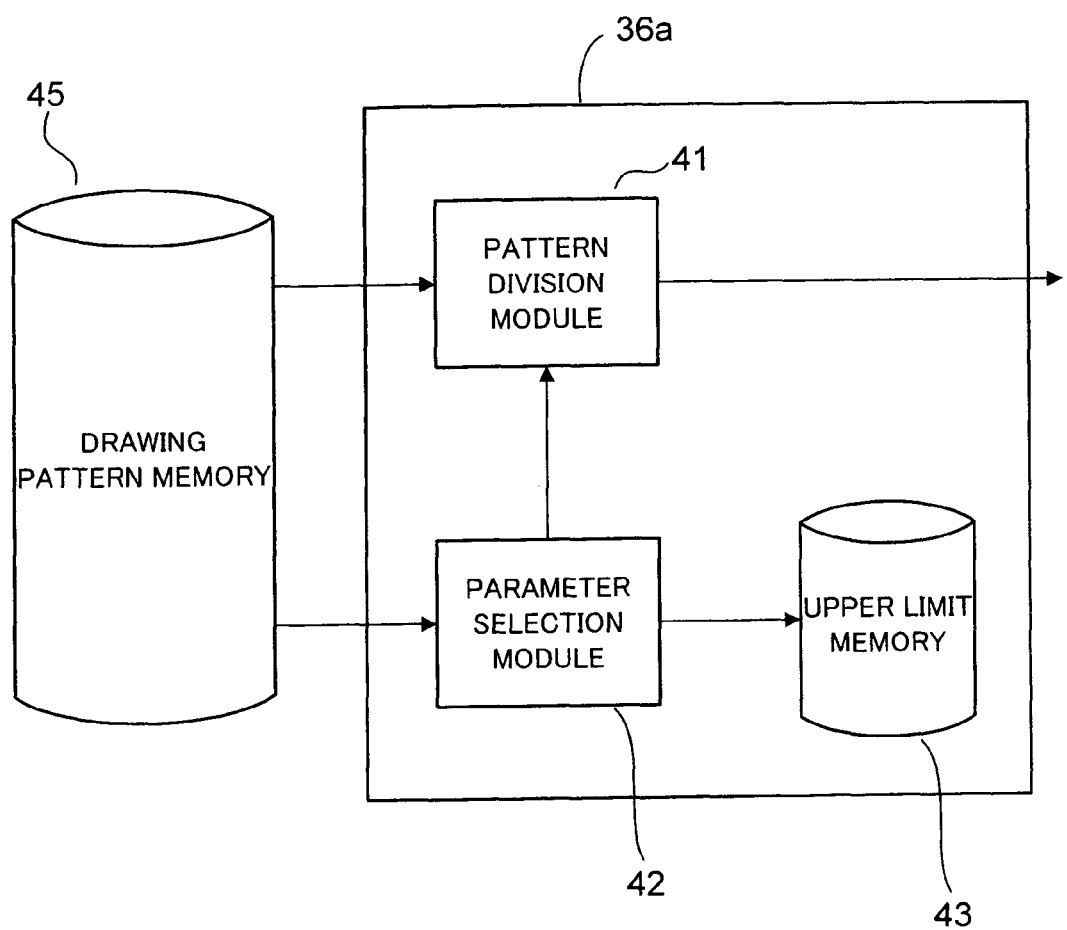
FIG. 4 is a block diagram showing the configuration of a drawing pattern adjustment unit.

FIG. 4 is a block diagram showing a structure of the divided drawing pattern data generation unit 36a to generate exposure beam conditions depending on the rank of a drawing pattern. The divided drawing pattern data generation unit 36a includes a parameter selection module 42 and a pattern division module 41. The divided drawing pattern data generation unit 36a also includes an upper limit memory 43 which stores upper limits necessary for drawing pattern division such as area upper limits.

The parameter selection module 42 calculates an upper limit in accordance with rank information on each drawing pattern, and outputs the upper limit to the pattern division module 41.

The pattern division module 41 receives a drawing pattern and an upper limit for pattern division, and generates divided drawing patterns.

For each drawing pattern, information necessary for drawing is defined, such as the drawing start position of the pattern to be drawn, the size of the pattern, and the degree of importance of the pattern. Such information is stored in a drawing pattern memory 45.

Figure 5A:
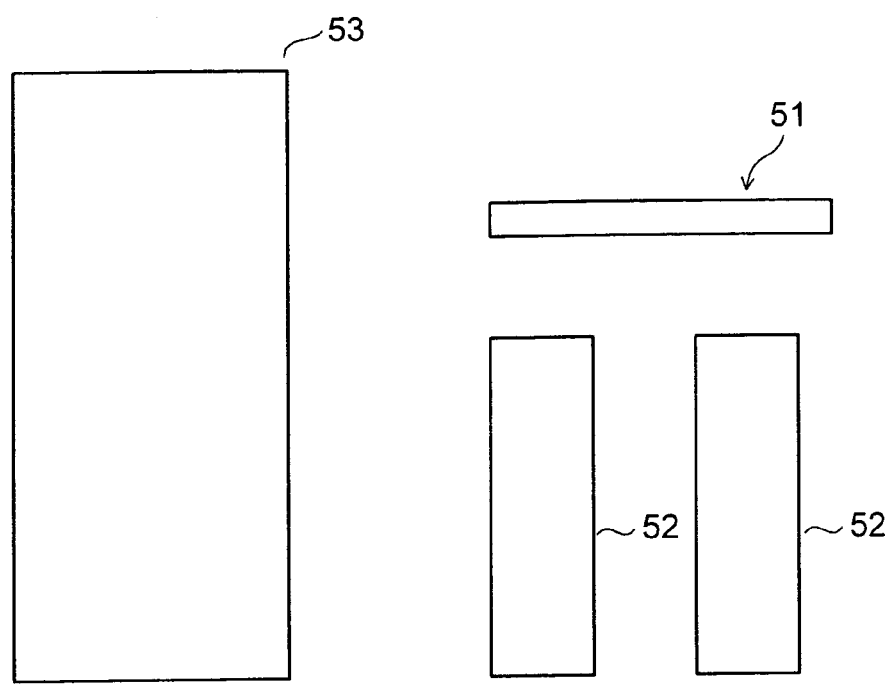
FIGS. 5A and 5B are views (part 1) for explaining the division of drawing patterns in accordance with rank.
Figure 5B:
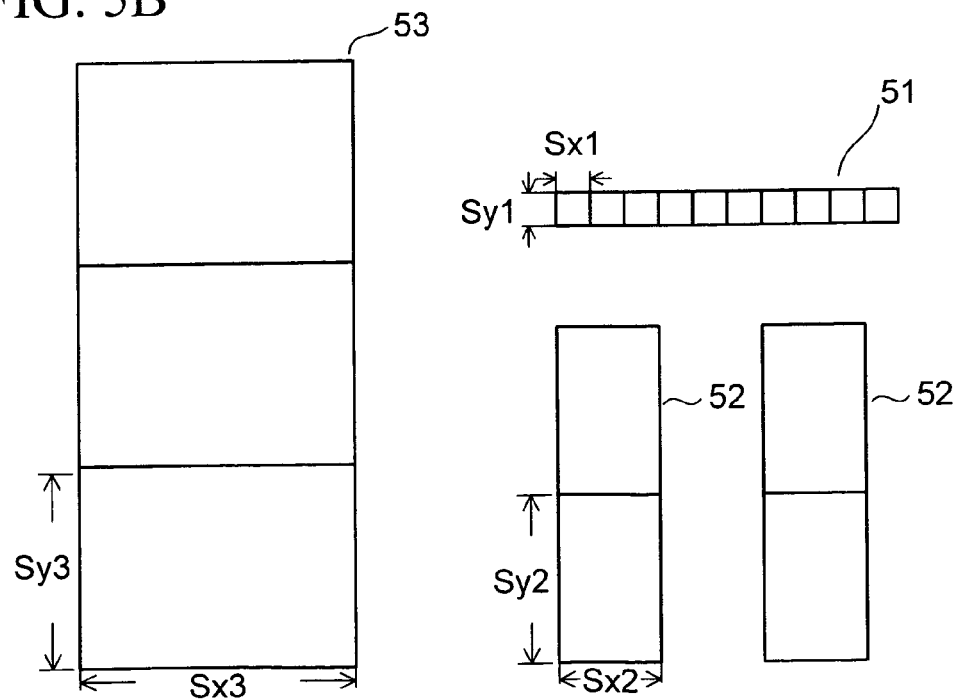
Figures 6A, 6B:
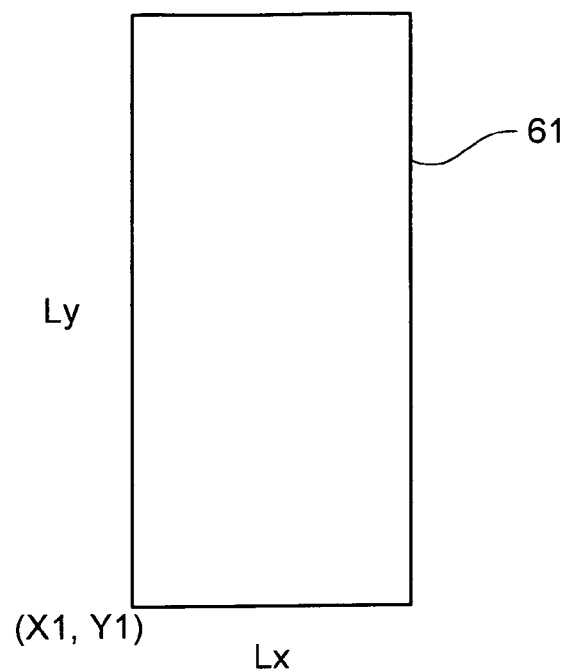
FIGS. 6A and 6B are views showing one example of the data structure of a drawing pattern.

FIGS. 5A and 5B are views showing examples of drawing patterns corresponding to device patterns to be formed on a sample. In FIG. 5A, it is assumed that patterns 51, 52, and 53 are rated as high rank, medium rank, and low rank, respectively. Data on such drawing patterns is stored in the drawing pattern memory 45. For example, for a drawing pattern 61 such as shown in FIG. 6A, drawing position coordinate values are (X1, Y1). The drawing pattern 61 is defined as a pattern having an origin at the position (X1, Y1) and having lengths Lx and Ly in x and y directions, respectively. FIG. 6B is a view showing one example of a data structure for the drawing pattern of FIG. 6A. This data structure contains data on the drawing position and the like and also contains data on rank.

In the case where a device pattern is formed by variable rectangular beam irradiation, a drawing pattern stored in a memory cannot be drawn by a variable rectangular beam in one shot due to a limitation on the irradiation size of the variable rectangular beam. For this reason, drawing pattern data is divided in accordance with a size which can be irradiated with the variable rectangular beam. In regard to a method for this division, three rules are discussed here: (1) a rule based on an upper limit on a rectangle's long-side length, (2) a rule based on an upper limit on a rectangle's area, and (3) a rule based on upper limits on a rectangle's long-side length and a rectangle's area. Incidentally, drawing pattern ranks are assumed to be classified into three levels: high rank, medium rank, and low rank.

(1) Rule Based on Upper Limit on Rectangle's Long-Side Length

Upper limits on a rectangle's long-side length are denoted by SL(H), SL(M), and SL(L) when drawing pattern ranks are high rank, medium rank, and low rank, respectively. These upper limits have the following relationship: SL(H)<SL(M)<SL(L).

In the case of a drawing pattern of high rank, the drawing pattern is divided such that each rectangle's long-side length is SL(H) or less. For the pattern 51 of FIG. 5B, Sx1 and Sy1 are selected such that the longer one of Sx1 and Sy1 is SL(H) or less.

Similarly, the drawing pattern 52 of medium rank is divided into drawing patterns such that each rectangle's long-side length is SL(M) or less. For the pattern 52 of FIG. 5B, Sx2 and Sy2 are selected such that the longer one of Sx2 and Sy2 is SL(M) or less. Similarly, in the case of the drawing pattern 53 of low rank in FIG. 5B, Sx3 and Sy3 are also selected such that the longer one of Sx3 and Sy3 is SL(L) or less.

Figure 7A:
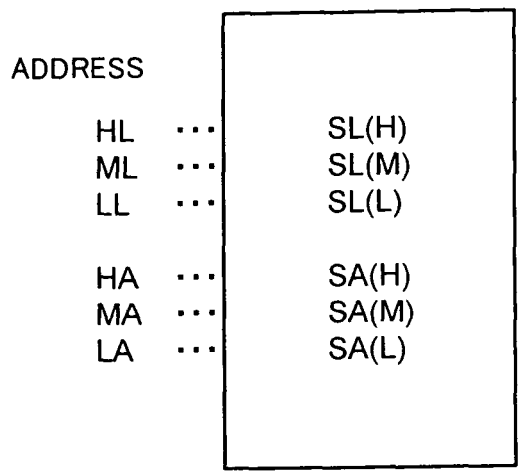
FIGS. 7A and 7B are views showing the configurations of upper limit memory and wait time definition memory.

Such upper limits (SL(H), SL(M), and SL(L)) are stored in the upper limit memory 43. FIG. 7A is a view showing one example of the data configuration of the upper limit memory 43. As shown in FIG. 7A, in the upper limit memory 43, a memory area indicated by an address corresponding to rank information on a drawing pattern has a defined upper limit corresponding to the rank information. For example, the case of high rank corresponds to an address HL in the upper limit memory 43, and the upper limit SL(H) is defined in the area specified by the address HL.

In FIG. 4, by specifying an address corresponding to a rank in the upper limit memory 43 as described above, the parameter selection module 42 extracts an upper limit corresponding to the rank. Based on the extracted upper limit, the pattern division module 41 divides a drawing pattern to generate new drawing pattern data.

Using the above-described rule based on long-side length upper limits, the amount of current can be specified. Specifically, in the case of a drawing pattern of low rank, an upper limit is set large to improve processing speed, and, in the case of a drawing pattern of high rank, an upper limit is set small to reduce the amount of current, and thus influences of Coulomb effects and the like are reduced so that high-accuracy drawing can be performed.

(2) Rule Based on Upper Limit on Rectangle's Area

Upper limits on a rectangle's area are denoted by SA(H), SA(M), and SA(L) when drawing pattern ranks are high rank, medium rank, and low rank, respectively. These upper limits have the following relationship: SA(H)<SA(M)<SA(L).

In the case of a drawing pattern of high rank, the drawing pattern is divided such that each rectangle's area is SA(H) or less. For the pattern 51 of FIG. 5B, Sx1 and Sy1 are selected such that Sx1×Sy1 is SA(H) or less.

Similarly, in the case of a drawing pattern of medium rank, the drawing pattern is divided such that each rectangle's area is SA(M) or less. For the pattern 52 of FIG. 5B, Sx2 and Sy2 are selected such that Sx2×Sy2 is SA(M) or less. Similarly, in the case of the drawing pattern 53 of low rank, Sx3 and Sy3 are also selected such that Sx3×Sy3 is SA(L) or less.

Similar to the upper limits on a long-side length, the upper limits on an area are also stored in the upper limit memory 43. By specifying an address corresponding to rank information, an upper limit is acquired. For example, the case of high rank corresponds to an address HA in the upper limit memory 43, and the upper limit SA(H) is defined in the area specified by the address HA.

In FIG. 4, the pattern division module 41 receives the area upper limit determined by the parameter selection module 42 and a drawing pattern acquired from the drawing pattern memory 45, and divides the drawing pattern into drawing patterns, each corresponding to the shape of one shot of a beam, in accordance with the rank information.

Incidentally, in the case of high rank, Sx1 and Sy1 which satisfy that Sx1×Sy1 is SA(H) or less are desirably selected such that the ratio between Sx1 and Sy1 is approximately 1:1.

Using the above-described rule based on area upper limits, the amount of current can be specified. Accordingly, in the case of a drawing pattern of low rank, an area upper limit is set large to improve processing speed, and, in the case of a drawing pattern of high rank, an area upper limit is set small to reduce the amount of current, and thus influences of Coulomb effects and the like are reduced so that high-accuracy drawing can be performed.

(3) Rule Based on Upper Limits on Rectangle's Long-Side Length and Rectangle's Area In the case where a rule is set based on an area upper limit, an upper limit is set smaller for a higher rank because it is desirable that the amount of current decrease with increasing rank. For example, the area upper limit is assumed to be 0.5 $\mu m^2$. Possible divided drawing patterns satisfying the above-described condition include various ones such as shown in FIGS. 8A to 8C. FIG. 8A shows the case where there is a large difference in length between the long and short sides of a rectangle, i.e., the case of a long, narrow pattern. This pattern satisfies the rule on the area upper limit. However, in the actual irradiation of this pattern, a misalignment in a junction between patterns is prone to occur when a pattern is connected to the pattern in the direction of the long sides of the pattern.

As described above, factors causing a decrease in pattern accuracy include the magnitude of the amount of current and the ratio between the lengths of the long and short sides of a drawing pattern.

When the amount of current is an issue, a pattern may be divided in accordance with an area upper limit. However, in the case where the ratio between the lengths of long and short sides is large, i.e., in the case of a long, narrow pattern, the accuracy of a pattern may decrease even if the area of the pattern is small.

For this reason, according to rules on both an area upper limit and a long-side length upper limit, a pattern is divided into drawing patterns which can be drawn with high accuracy.

It is assumed that patterns are divided based on an area upper limit (e.g., an upper limit of 0.5 $\mu m^2$ for high rank) to obtain patterns shown in FIGS. 8A to 8C. At this stage, all the patterns of FIGS. 8A to 8C satisfy the condition on the area upper limit.

Next, the patterns divided in accordance with the area upper limit are further divided in accordance with a long-side length upper limit (e.g., an upper limit of 1 $\mu m$ for high rank). The patterns of FIGS. 8A to 8C are divided into patterns such as shown in FIGS. 8D to 8F in accordance with the condition for the long-side length upper limit, respectively. These patterns obtained by division such as shown in FIGS. 8D to 8F satisfy both the area upper limit and the long-side length upper limit.

Figure 9:
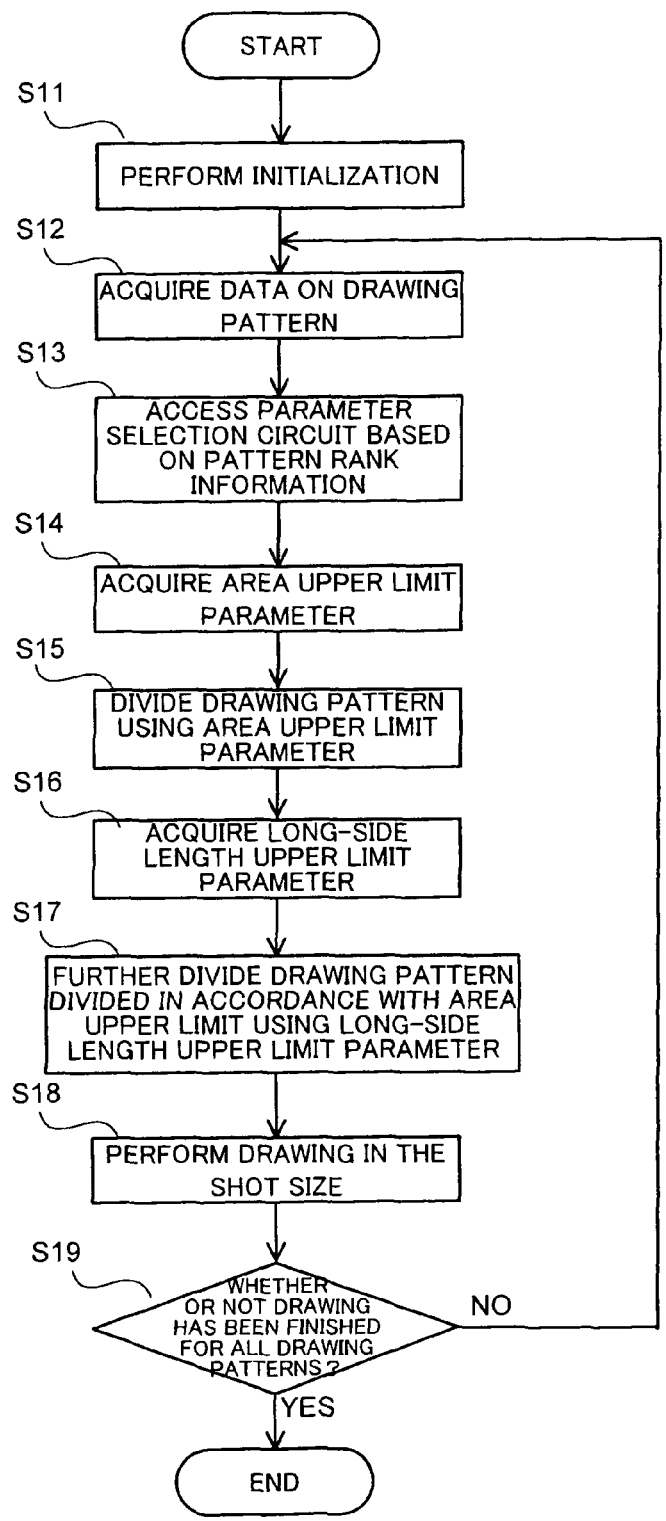
FIG. 9 is a flowchart showing a drawing pattern division process.

FIG. 9 is a flowchart of a process to divide a drawing pattern under conditions of upper limits on a rectangle's long-side length and a rectangle's area.

First, in step S11, initialization is performed. In the initialization, an area upper limit parameter SA(rank) and a long-side length upper limit parameter SL(rank) are set in the upper limit memory 43.

Next, in step S12, data on a drawing pattern is inputted from the drawing pattern memory 45 to the pattern division module 41 and the parameter selection module 42. The drawing pattern data contains information such as a drawing start position of a pattern defined to form a device pattern, the size of the pattern, and the rank which indicates the degree of importance of the pattern.

Then, in step S13, the upper limit memory 43 is accessed by specifying an address corresponding to drawing pattern rank information included in the drawing pattern data acquired in step S12.

Subsequently, in step S14, an area upper limit parameter (SA(H), SA(M), or SA(L)) corresponding to the rank information is acquired. An upper limit is acquired which is defined in an area indicated by the address in the upper limit memory 43 which has been accessed in step S13.

Next, in step S15, using the area upper limit parameter, the drawing pattern data is divided. An area to be drawn at a time decreases with increasing rank of a device pattern. For example, in the case of the drawing pattern 51 shown in FIG. 5B, Sx1 and Sy1 are determined such that Sx1×Sy1 is SA(H) or less. Although there are a plurality of conceivable divided patterns which satisfy the area upper limit, the ratio between long and short sides is preferably approximately 1:1 in the case where a divided size is specified only by the area upper limit. Incidentally, in this process, since a long-side length upper limit is specified in a later step, division into long, narrow patterns may be performed.

Subsequently, in step S16, a long-side length upper limit parameter (SL(H), SL(M), or SL(L)) corresponding to the rank information is acquired. An upper limit is extracted which is defined in an area indicated by the address in the upper limit memory 43 which has been accessed in step S13.

Next, in step S17, using the long-side length size upper limit parameter, the drawing pattern data divided in accordance with the area upper limit is further divided.

Then, in step S18, drawing is performed under exposure conditions generated in step S17.

Subsequently, in step S19, a determination is made as to whether or not drawing has been finished for all drawing patterns. If drawing has been finished for all drawing patterns, this process is terminated. If drawing has not been finished for all drawing patterns, the process returns to step S12 to be continued.

Incidentally, instead of dividing a drawing pattern in the pattern division module 41 as described above, the drawing pattern memory 45 may store data in which a drawing pattern is divided beforehand to be capable of being drawn with a variable rectangular beam. In this case, drawing is performed in accordance with the data stored in the drawing pattern memory 45.

Next, a description is made of drawing in accordance with drawing pattern rank in character projection lithography for which a stencil mask is prepared.

Figure 10A:
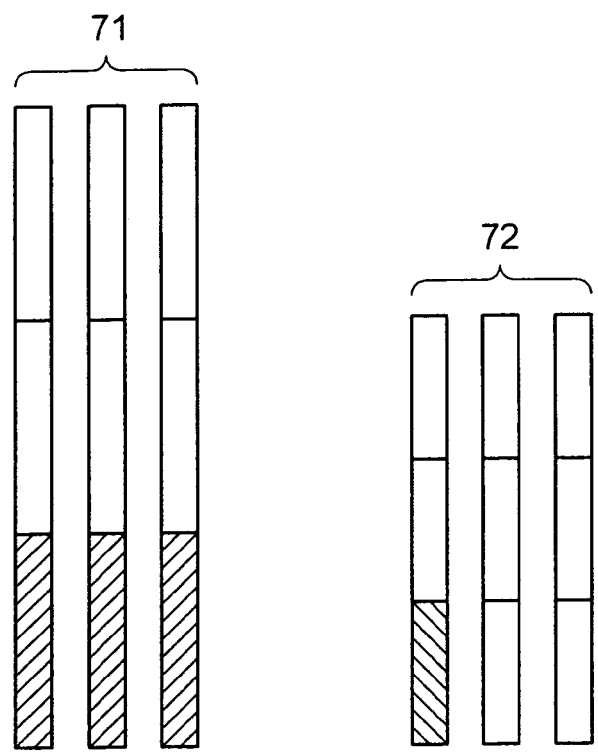
FIGS. 10A and 10B are views for explaining the selection of a mask in accordance with rank.
Figure 10B:
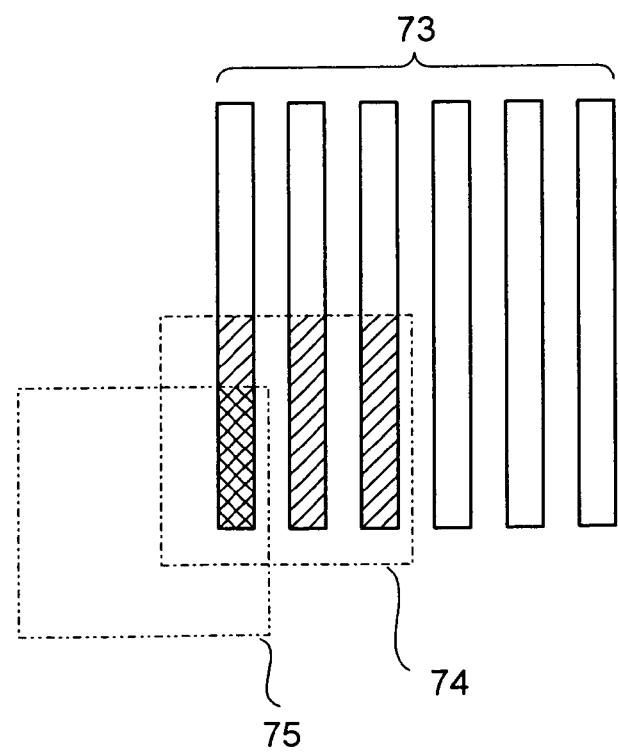

FIG. 10A is a view showing examples of drawing patterns, and shows an example including a high-rank drawing pattern 72 and a low-rank drawing pattern 71. FIG. 10B shows one example of a stripe-shaped stencil mask 73. Shown here is the case where both the high-rank pattern 72 and the low-rank pattern 71 are long, narrow patterns and where these patterns can be formed by using the stencil mask 73. For the low-rank pattern 71, high accuracy is not required, and therefore the size of a beam can be increased. As indicated by a beam cross section 74 in FIG. 10B, a selected range (indicated by slashes in FIG. 10B) is set large such that a large portion of the stencil mask 73 is contained therein. Thus, the range of a pattern to be drawn at a time is set wide. In the pattern 71 of FIG. 10A, portions with slashes are drawn at a time using the selected portion of the stencil mask 73. For the high-rank pattern 72, high accuracy is required, and therefore the size of a beam cannot be increased. Accordingly, as indicated by a beam cross section 75 in FIG. 10B, a selected range (indicated by backslashes in FIG. 10B) is set small. Thus, drawing is performed by finely dividing a drawing pattern. In the pattern 72 of FIG. 10A, a portion with backslashes is drawn using the selected portion of the stencil mask 73.

In this case, as in the case of a variable rectangular beam, a beam size is determined in accordance with rank, part of a stencil mask is selected in accordance with the size. For example, a stencil mask to be selected and upper limits on the sizes of the stencil mask in x- and y-directions are specified in accordance with rank.

(Adjustment of Wait Time for Deflection Settling)

Next, a description will be made of the selection of wait time for deflection settling depending on rank.

Figure 11:
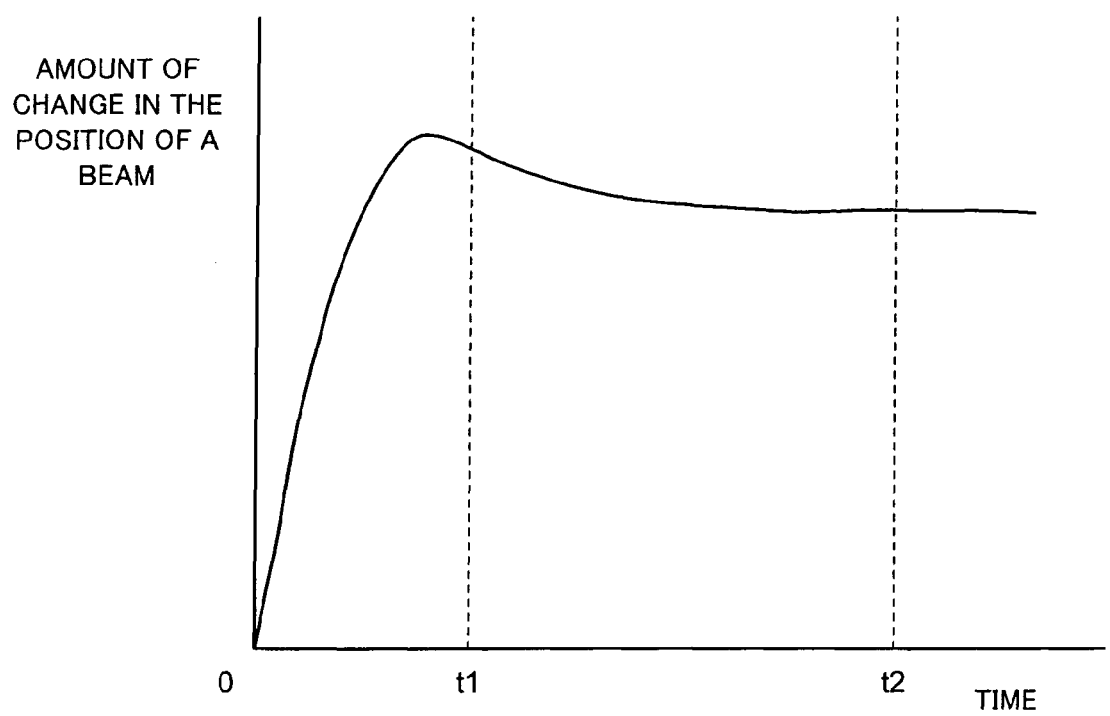
FIG. 11 is a view for explaining deflection settlement wait time.

FIG. 11 shows an electron beam settling curve obtained after an electron beam has been deflected. In FIG. 11, the horizontal axis represents time, and the vertical axis represents the amount of change in the position of a beam. In an electron beam lithography apparatus, after drawing is performed by shooting an electron beam at a predetermined position, the electron beam is deflected so that the position of the beam may be changed to a next shot position. For example, when the position of the beam is deflected using an octopolar deflector, the direction and amount of travel of the beam are determined by determining voltages applied to eight electrodes, respectively. FIG. 11 is a graph showing a situation in which the amount of change in the position of a beam settles after a deflection voltage has been applied to one electrode. In the case where a device pattern requiring high accuracy is drawn, it is necessary to wait until the amount of change in the beam position settles in the settling curve of FIG. 11, e.g., until time t2. On the other hand, though it takes a certain time before the beam position settles, the beam position is moved to the vicinity of the next shot position even at an earlier time such as time t1. Accordingly, for patterns not requiring high accuracy, it does not matter if drawing is started before settling. The wait time for deflection settling is also adjusted in accordance with the rank of a device pattern.

Figure 12:
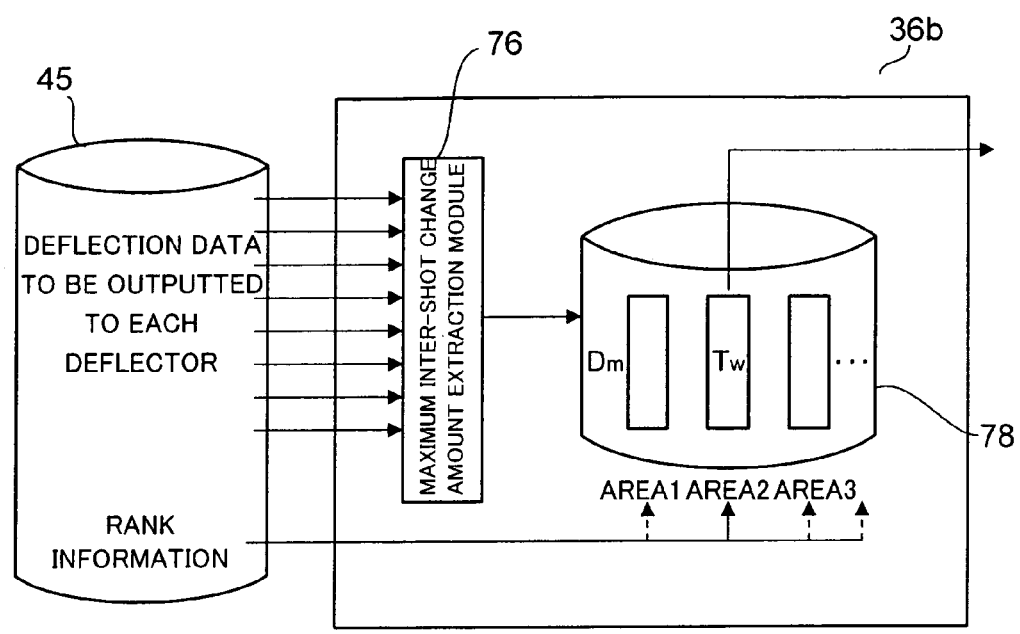
FIG. 12 is a block diagram showing the configuration of a deflection settlement wait time adjustment unit.

The determination of settlement wait time is performed when an electron beam is deflected, such as the time when main deflection or sub-deflection is performed, when a variable rectangular beam is formed, or the like. FIG. 12 shows a block diagram showing the configuration of the settlement wait time determination unit 36b.

The settlement wait time determination unit 36b includes a maximum inter-shot change amount extraction module 76 and wait time definition memory 78.

The maximum inter-shot change amount extraction module 76 receives deflection data to be outputted to each deflector (deflection electrodes) which is stored in the drawing pattern memory 45, and extracts a maximum change amount every time when deflection outputs are changed, i.e., in every shot-to-shot interval. For example, in the case where one deflector has eight electrodes, the deflection data to be outputted to each deflector includes deflection data set for each of the eight electrodes.

The settlement wait time determination unit 36b extracts rank information on the drawing pattern inputted from the drawing pattern memory 45, and selects a memory area corresponding to the rank in the wait time definition memory 78. Further, the settlement wait time determination unit 36b extracts a maximum inter-shot change amount for the drawing pattern, and, using the value (deflection travel amount of an electron beam) thereof as an address, extracts a wait time from the memory area corresponding to the rank.

For example, in FIG. 12, the following is assumed: the deflection travel amount extracted by the maximum inter-shot change amount extraction module 76 is Dm, and the memory area corresponding to the rank is area 2. In this case, a value Tw corresponding to the address Dm in memory area 2 is the wait time.

Figure 7B:
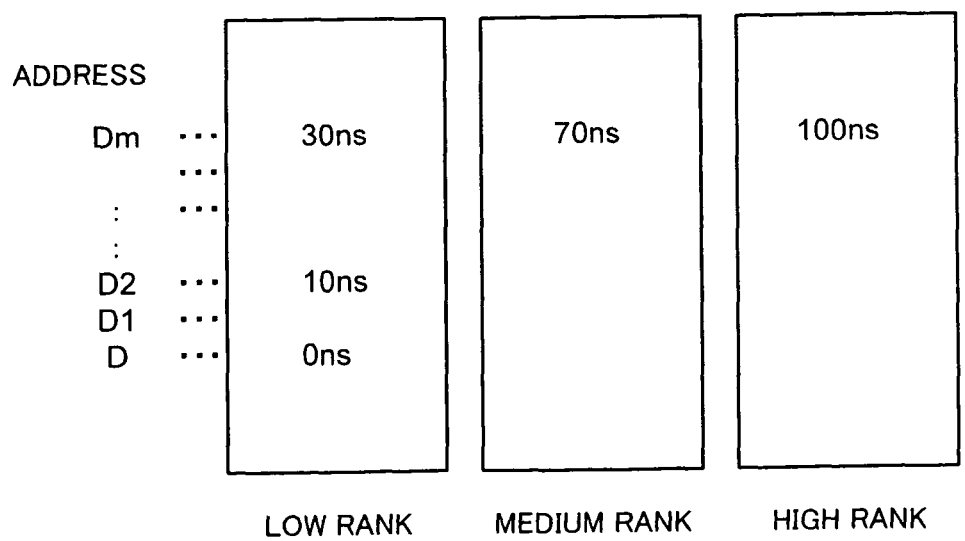

FIG. 7B shows one example of the data configuration of the wait time definition memory 78.

As shown in FIG. 7B, memory areas are prepared for low, middle, and high ranks, respectively. By specifying each of the areas using a deflection travel amount as an address, a settlement wait time in accordance with rank can be extracted. A settlement wait time in accordance with rank can be easily extracted, for example, as follows: in the case where the deflection travel amount is Dm, settlement wait times for low rank, medium rank, and high rank are 30 ns, 70 ns, and 100 ns, respectively.

(Description of Electron Beam Lithography Method)

Next, a description is made of an electron beam lithography method in the above-described electron beam lithography apparatus.

Figure 13:
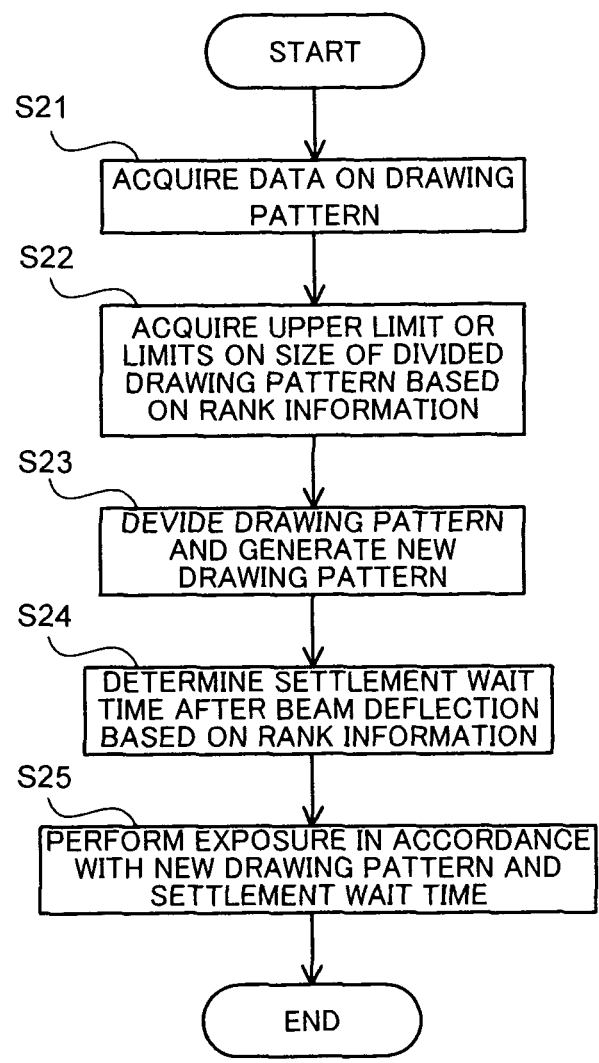
FIG. 13 is a flowchart showing one example of an electron beam lithography process.

FIG. 13 is a flowchart for explaining a lithography method by an electron beam lithography apparatus according to this embodiment.

First, in step S21, data on a drawing pattern is acquired which includes rank information corresponding to the accuracy required for the drawing pattern.

Then, in step S22, based on the rank information acquired in step S21, an upper limit or limits on the size of a divided drawing pattern to divide the drawing pattern is acquired. As the upper limit or limits, an upper limit on a rectangle's long-side length and an upper limit on a rectangle's area are specified in the case of a variable rectangular beam, and an upper limit on a selected range on the stencil mask is specified in the case of character projection lithography. The upper limit or limits are extracted by addressing the upper limit memory 43 in which upper limits in accordance with rank are specified beforehand, using an address corresponding to the rank information.

Next, in step S23, divided drawing patterns are determined within the upper limit or limits acquired in step S22. For example, in the case where the upper limit is an upper limit on the area of a variable rectangle, divided drawing patterns are determined such that the area thereof are smaller than the area upper limit and that the ratio between long and short sides is approximately 1:1.

Subsequently, in step S24, based on the rank information, a settlement wait time after beam deflection is determined. Similar to the upper limit, the settlement wait time is also stored in the wait time definition memory 78 beforehand. By addressing the wait time definition memory 78 using an address in accordance with the rank information, a settlement wait time in accordance with rank is extracted.

Then, in step S25, an electron beam is applied onto a sample in accordance with the divided drawing patterns and the settlement wait time to generate a device pattern.

As described above, in the electron beam lithography apparatus and electron beam drawing method of this embodiment, a drawing pattern is divided in accordance with the rank of the drawing pattern, and a deflection settlement wait time is adjusted in accordance with the rank of the drawing pattern.

For example, in the case where the rank of a drawing pattern is high, since high-accuracy drawing is required, electron beam irradiation is performed with the drawing pattern divided into small patterns. Further, the settlement wait time after deflection is adjusted such that a sufficient time elapses before the electron beam settles. On the other hand, in the case where the rank of a drawing pattern is low, high-accuracy drawing is not required. Accordingly, electron beam irradiation is performed with the drawing pattern divided into large patterns, and the settlement wait time after deflection is set short such that irradiation is performed when the electron beam reaches an irradiation position even before an electron beam sufficiently settles. Thus, it becomes possible to carry out the generation of a device pattern at high speed with sufficient accuracy overall.

It should be noted that the present invention is a patent application (patent application to which Article of the Industrial Technology Enhancement Act of Japan is applied) pertaining to the result of research (research in a project named "Development of Comprehensive Optimization Technologies to Improve Mask Design, Drawing and Inspection," entrusted by New Energy and Industrial Technology Development Organization in fiscal year 2008) entrusted by the Japanese national government or the like.

What is claimed is:

1. An electron beam lithography method comprising the steps of:
    acquiring data, using a column cell controller, on a drawing pattern assigned a rank in accordance with an accuracy required for a device pattern to be formed on a sample;
    acquiring an upper limit on a size and an upper limit on a long-side length of a divided drawing pattern based on the rank, both of the upper limits being used to generate divided drawing patterns by dividing the drawing pattern;
    generating data on divided drawing patterns satisfying both of the upper limits;
    determining a settlement wait time after the deflection of the electron beam based on the rank; and
    irradiating the electron beam onto the sample in accordance with the data on the divided drawing patterns and the settlement wait time;
    wherein the drawing pattern is firstly divided by the upper limit on the area size and then divided by the upper limit on the long-side length.

2. The electron beam lithography method according to claim 1, wherein
    the settlement wait time is determined by a deflection travel amount of the electron beam based on the rank.

3. The electron beam lithography method according to claim 1, wherein
    the upper limit on the area size and the upper limit on the long-side length are defined for each of the ranks, and
    the settlement wait time is defined for each of the ranks.

4. The electron beam lithography method according to claim 1, wherein
    the ranks are configured by a plurality of different ranks from a low rank to a high rank with a predetermined range of accuracy,
    the upper limit on the area size and the upper limit on the long-side length increase from the high rank to the low rank, and
    the settlement wait time decreases from the high rank to the low rank.

5. The electron beam lithography method according to claim 1, wherein
    the divided drawing patterns satisfy a ratio of 1:1 between a length of x direction and a length of y direction.

6. The electron beam lithography method according to claim 1, further comprising the steps of:
    determining an upper limit on a partial irradiation range of a mask pattern based on the rank of the drawing pattern, and determining a use range of the mask pattern in accordance with the upper limit, and
    determining the settlement wait time in accordance with a deflection travel amount of the electron beam based on the rank.

* * * * *